United States Patent [19]
Lehman
[11] 3,874,919
[45] Apr. 1, 1975

[54] OXIDATION RESISTANT MASK LAYER AND PROCESS FOR PRODUCING RECESSED OXIDE REGION IN A SILICON BODY

[75] Inventor: Herbert S. Lehman, Poughkeepsie, N.Y.

[73] Assignee: International Business Machines Corporation, Armonk, N.Y.

[22] Filed: Mar. 13, 1974

[21] Appl. No.: 450,631

[52] U.S. Cl. .................................. 117/212, 148/187
[51] Int. Cl. ........................... B44d 1/18, H01l 7/44
[58] Field of Search ..................................... 117/212

[56] References Cited

UNITED STATES PATENTS 3,765,935 10/1973 Rand et al. ......................... 117/212

*Primary Examiner*—John D. Welsh
*Attorney, Agent, or Firm*—Wolmar J. Stoffel

[57] ABSTRACT

An oxidation resistant masking layer for a semiconductor body having a first layer of oxygenated silicon nitride material having a refractive index in the range of 30 1.60 to 1.85, and a second overlying layer of $Si_3N_4$ bonded to the first layer having a thickness of at least 100 Angstroms.

A process for forming recessed thermal $SiO_2$ isolation regions in a silicon semiconductor body wherein a masking layer is deposited on the silicon body by depositing a blanket layer of oxygenated silicon nitride and an overlying blanket layer of $Si_3N_4$, forming openings in the resultant composite masking layer and etching grooves into the silicon semiconductor layer to the desired thickness thus defining the desired recessed isolation regions, and exposing the resultant structure to an oxidizing environment for a time sufficient to form the desired silicon oxide recessed regions.

4 Claims, 4 Drawing Figures

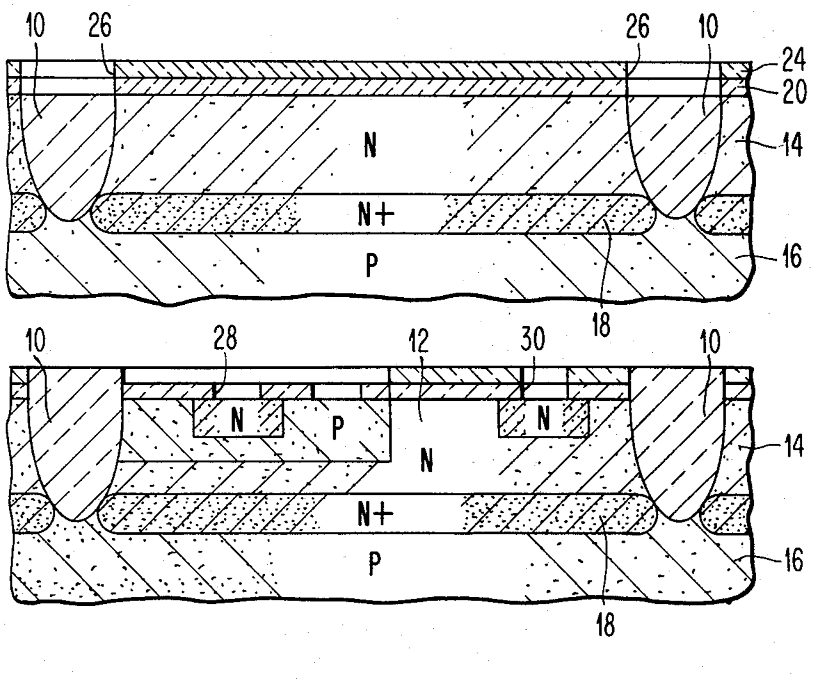
FIG. 1, FIG. 2
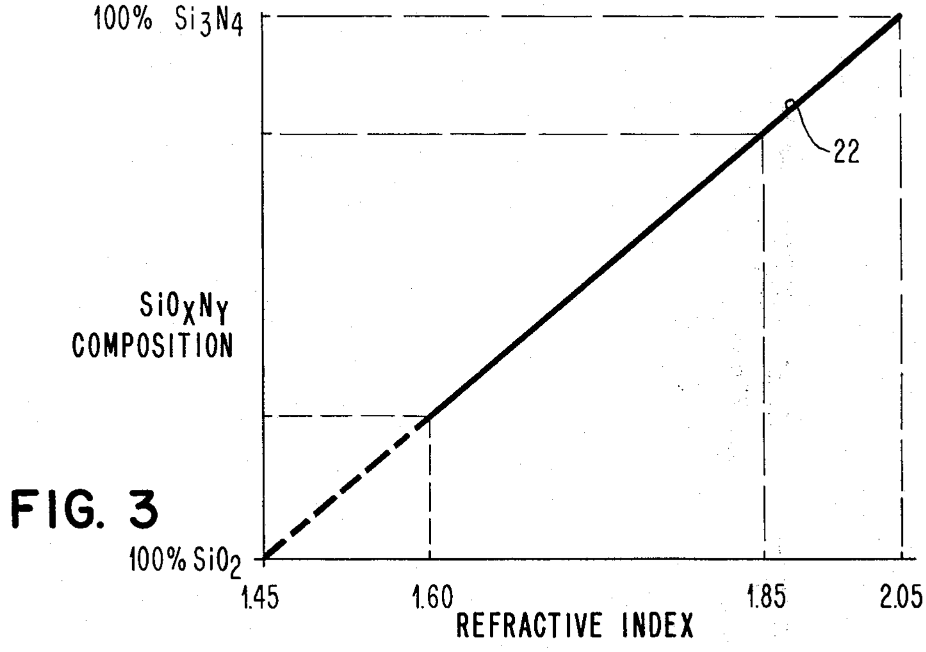
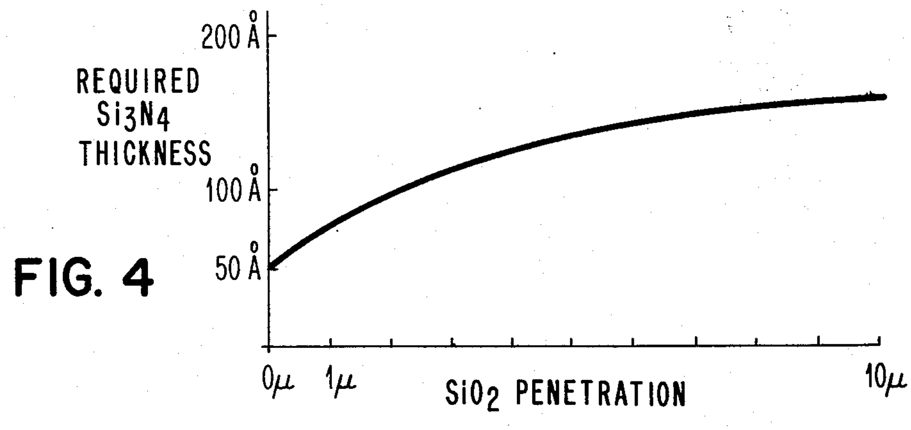

OXIDATION RESISTANT MASK LAYER AND PROCESS FOR PRODUCING RECESSED OXIDE REGION IN A SILICON BODY

BACKGROUND OF THE INVENTION

This invention relates to semiconductor devices and, more particularly, to a composite masking layer adapted for forming oxide regions in the body of the device.

In recent years, great technical progress has been achieved in the semiconductor technology. A great deal of the progress has come about by various efforts to decrease the size of the device elements, place large numbers of device elements on a single substrate, and connect the devices into many active circuits. This microminiaturization has decreased the cost of the devices while increasing their efficiency and speed of operation.

With the use of increased microminiaturization, there was introduced also the need for better fabrication techniques, as for example, in masking, etching, and diffusion. An acute problem faced within the semiconductor industry was providing a suitable isolation for electrically isolating the device elements on the substrate. The isolation desirably should take up as little space as possible, and not contribute to the capacitive nature of certain devices which would decrease their rate of operation. Initially, isolation was achieved by utilizing back-biased PN junctions. A relatively recent improvement was the utilization of a combination of dielectric isolation to isolate the sidewalls of the individual device elements and a PN junction for isolating the bottom surfaces. The structure and technique is described in U.S. Pat. No. 3,648,125. This technique basically consists of forming a PN junction within the body of the device, forming an oxidation resistant mask on the surface, removing portions of the mask to define a grid or network opening over the intended dielectric regions, and subsequently exposing the structure to an oxidizing atmosphere to oxidize the exposed silicon thereby forming regions that extend inwardly into the device down to the PN junction.

The oxidation mask used was normally a composite layer of $SiO_2$ and $Si_3N_4$. The $Si_3N_4$ was provided because it formed an impervious barrier that effectively prevented oxidation of areas it masked. The $SiO_2$ was provided between the silicon body and the $Si_3N_4$ layer to prevent the damaging effect to the monocrystalline body surface when $Si_3N_4$ is placed directly on the body.

The $SiO_2$—$Si_3N_4$ masking layer performed its intended function although it was noted that it had certain limitations. The intermediate $SiO_2$ layer allowed a degree of migration of sodium ions which frequently resulted in inversion problems, particularly in field effect transistor device applications. There was also an inherent thermal mismatch between the silicon body and the $SiO_2$ layer which during thermal cycling placed stress on the silicon crystalline structure. This frequently resulted in structural damage leading ultimately to leakage. The composite layer also required the deposition of each layer in a separate apparatus. This required at least two heat cycles which inherently affects any diffused regions within the device. Further, since the deposition apparatus must be opened and the semiconductor body transferred, there was a greater chance of contamination by dust, etc. This additional handling also increased the probability of damage and required additional work and effort. Also, the separate layers required separate etchants which introduced problems.

Prior to applicant's invention, there existed a need for an improved oxidation mask that reduced subsequent leakage within the device, minimized the damage to the semiconductor body, and required less time, effort and handling to deposit mask and etch.

SUMMARY OF THE INVENTION

An object of this invention is to provide an improved composite oxidation mask particularly adapted for oxidizing selected regions of a silicon semiconductor body.

Another object of this invention is to provide an improved method of forming recessed oxide regions in a semiconductor body.

These and other objects are achieved in the oxidation mask comprised of a first layer of oxygenated silicon nitride material having a refractive index in the range of 1.60 to 1.85, and a thickness greater than 50 Angstroms deposited directly on the semiconductor body, and an overlying second layer of $Si_3N_4$ bonded to the first layer and having a thickness of at least 100 Angstroms. The process of the invention is comprised of forming on the surface of the silicon semiconductor body a composite oxidation masking layer of a first blanket layer of oxygenated silicon nitride, and a second overlying blanket layer of $Si_3N_4$ on the first layer, forming openings in the resultant composite layer to define the desired recessed isolation regions, and to expose the resultant structure to an oxidizing environment for a time sufficient to form the desired silicon oxide regions.

BRIEF DESCRIPTION OF THE DRAWINGS

FIGS. 1 and 2 are elevational cross-sectional views in broken section of a semiconductor at different stages of fabrication that illustrate the method and use of the oxidation resistant masking layer of the invention.

FIG. 3 is a graph depicting the correlation between the refractive index and the composition of a silicon oxynitride layer.

FIG. 4 is a graph of required $Si_3N_4$ masking thickness and silicon oxide penetration.

DESCRIPTION OF PREFERRED EMBODIMENTS

Referring now to FIG. 2 of the drawing, there is depicted a cross-sectional elevational view illustrating the general structure of recessed oxidation isolation. The device isolation consists basically of an annular region 10 of $SiO_2$ that surrounds a monocrystalline silicon region 12 having device structure therein. Region 10 extends through or partially through the epitaxial silicon layer 14 that is supported on monocrystalline semiconductor substrate 16, conventionally silicon. A PN junction provides the isolation for the bottom of monocrystalline region 12. In FIG. 2, the PN junction between the sub-collector region 18 and substrate 16 performs this function. In an integrated circuit, many such devices both active and passive, are fabricated in an epitaxial silicon layer having a thickness on the order of 2 microns supported on the substrate 16. The devices are insulated at the sidewalls by the annular regions 10, and an underlying PN junction.

Referring now to FIG. 1, recessed oxidation isolation structure is formed by providing monocrystalline semiconductor substrate 16. The surface of substrate 16 is oxidized, and diffusion windows opened using photolithographic and etching techniques. A diffusion of an impurity opposite in conductivity to the impurity in the substrate, as for example arsenic, forms regions 18 that embody a significantly higher doping concentration than substrate 16. The masking layer, not shown, is then removed, and an epitaxial layer 14 of monocrystalline silicon is deposited on substrate 16 using known deposition techniques. The oxidation resistant masking layer of the invention is then deposited on the surface of epitaxial layer 14. The masking layer of the invention consists of a lower layer 20 of silicon oxynitride having a thickness of at least 100 Angstroms. The composition of the silicon oxynitride layer has a refractive index between 1.60 and 1.85. The correlation between refractive index and the composition of the silicon oxynitride layer is illustrated in FIG. 3 of the drawings by curve 22. Also indicated is the refractive index range for use as the underlying layer of the composite masking layer of the invention. An overlying layer 24 of $Si_3N_4$ is deposited on layer 20. Openings 26 are then made through layers 20 and 24 that define the shape of the desired annular isolation regions. Openings 26 are made by using conventional photolithographic and masking techniques and etching both the layers 24 and 20 by subtractive etching. A layer of $SiO_2$ is often used as the masking layer due to the interaction of the usual nitride etchant ($H_3PO_4$) with organic resists. One of the advantages of the oxidation mask of this invention is that the same etchant can be used to remove both layers 20 and 24. A preferred etchant is hot $H_3PO_4$. After the openings 26 have been made, a portion of the epitaxial layer 14 is removed. This can be done with any suitable etchant for silicon, as for example, $HF\text{-}HNO_3$ etchant. The device is then exposed to an oxidizing atmosphere for a time suitable to thermally oxidize the exposed silicon so that the annular regions extend into the device to contact a PN junction. Another advantage of the oxidation resistant masking layer of the invention is that the layers 20 and 24 can be deposited by the same apparatus without the need for opening the chamber and handling the device between operations. The silicon oxynitride layer can be formed by pyrolytic deposition techniques. In this process, the substrate is deposited in a conventional reaction tube and heated to a temperature on the order of 900°C on a graphite susceptor. A carrier gas, as for example nitrogen, is flowed through the reaction chamber along with a silicon bearing compound, as for example, $SiBr_4$, $SiCl_4$ or SiH, and $NH_3$ and $O_2$. The amounts of the various reactants are adjusted to produce the desired silicon oxynitride composition. After the oxynitride layer has been formed, the oxygen stream is terminated and the overlying layer of $Si_3N_4$ formed. Alternately, the layers 20 and 24 can be produced by RF sputtering from a $Si_3N_4$ target or DC reactive sputtering of a silicon target. In the case of RF sputtering, the silicon oxynitride layer is formed by the admission of a small amount of oxygen or air to the usual inert (AR or $N_2$) ambient. The flow is terminated when pure $Si_3N_4$ is desired for the upper layer 24. For DC sputtering from a silicon target, the oxynitride layer is formed by reactive sputtering in an oxygen-nitrogen environment; the oxygen flow is terminated to achieve the silicon nitride layer 24. The minimum thickness of the $Si_3N_4$ layer 24 can be determined by the graph depicted in FIG. 4. Knowing the $SiO_2$ penetration of region 10, the required $Si_3N_4$ thickness to withstand the oxidation can be determined.

The oxidation mask of this invention provides a solution for overcoming the undesired effects of the known oxidation masking layers of the invention, namely, a single $Si_3N_4$ layer on the silicon or alternatively, a composite layer of $SiO_2$ and an overlying layer of $Si_3N_4$. It has been observed that when $Si_3N_4$ is deposited directly on the surface of a silicon semiconductor body and utilized as an oxidation mask, the surface of the silicon is damaged. This damage apparently results from the differences in the coefficient of expansion between the silicon and $Si_3N_4$. This damage to the silicon crystalline structure frequently results in leakage in the completed device. This leakage is particularly objectionable in field effect transistor applications. The $SiO_2$—$Si_3N_4$ composite mask layer also has drawbacks. It is theorized that the $SiO_2$ underlying layer is relatively porous and allows electrons to be transported through the oxide layer without appreciable trapping. On entering the nitride layer where the field is lower than in the initial $SiO_2$ layer, the electrons are trapped probably very near the nitride-oxide interface. This produces a gross instability that produces a negative space charge in the nitride. The oxidation mask of the invention consisting of a composite layer of silicon oxynitride and an overlying layer of $Si_3N_4$ does not significantly damage the surface of the silicon since the thermal coefficient of expansion of silicon oxynitride more closely matches that of silicon, and there is no oxide-nitride interface to trap electrons as is in the $SiO_2$—$Si_3N_4$ composite layer. The CV characteristics of the Si—$Si_3N_4$ and the Si—$SiO_2$—$Si_3N_4$ structures are discussed in detail in an article entitled "The Preparation and CV Characteristics of Si—$Si_3N_4$ and Si—$SiO_2$—$Si_3N_4$ Structures" by Chu, Szedon and Lee, Solid State Electronics, Vol, 10, 1967, pp. 897–905.

The following example is set forth to more clearly explain a preferred specific embodiment of the invention and is not intended to limit the scope of the invention.

EXAMPLE 1

An $SiO_2$ masking layer was deposited on a P-type silicon wafer having a resistivity of 10 ohm/cm. The $SiO_2$ layer was formed by heating the wafer to 1,000°C, exposing it to pure $O_2$ for 10 minutes, to steam for 100 minutes, and to $O_2$ for 10 minutes, all at atmospheric pressures. An opening was made through the resultant $SiO_2$ layer for a sub-collector diffusion window using conventional photolithographic techniques. The resultant structure was then placed in a capsule containing arsenic, and maintained at a temperature of 1,200°C for 120 minutes. This resulted in a high conductivity arsenic doped sub-collector. The exposed surface of the diffusion window was reoxidized, and the oxide subsequently removed completely from the surface of the substrate. A 2 micron layer of epitaxial silicon was then grown on the substrate using a reactant stream of $SiCl_4$ and $H_2$ embodying $AsH_4$ as a dopant. The oxidation resistant masking layer of the invention was then deposited on the surface of the epitaxial layer. A first layer of silicon oxynitride was deposited by placing the semiconductor structure in a horizontal rectangular quartz reaction chamber that was approximately 3¼ inches long by 2 inches square, on an R. F. graphite susceptor provided with a silicon carbide coating. The substrate was heated to a temperature of 900°C and an $N_2$ carrier gas introduced at a rate of 12 litres per minute. Added to the carrier gas was $SiBr_4$ at a rate of 60 cc/min., $NH_3$ at a rate of 120 cc/min., and $O_2$ at 250 cc/min. The growth rate of the silicon oxynitride under these conditions was 20 Angstroms per minute. When a layer thickness of 100 Angstroms has been deposited, the $O_2$ stream was turned off. Subsequent measurements indicated that the refractive index of the silicon oxynitride layer was 1.65. With the oxygen stream removed, a layer of $Si_3N_4$ was deposited. When a thickness of 100 Angstroms was deposited, the reactant streams were turned off and the wafer allowed to cool. A layer of photoresist was deposited, and a pattern exposed to produce an annular opening surrounding the perimeter of the sub-collector region previously fabricated. Both the silicon nitride and the silicon oxynitride layer were then etched utilizing hot $H_3PO_4$. Approximately 1.2 microns of silicon was removed by a solution of HF-$HNO_3$. After the resist was removed, the resultant structure was exposed to an oxidizing environment to oxidize the remaining 0.8 microns of silicon and thereby produce an annular $SiO_2$ region for sidewall dielectric isolation. The oxidizing environment consisted of 10 minutes in dry oxygen, 1,000 minutes in steam and 10 minutes in dry oxygen with the silicon substrate heated to a temperature of 1,000°C. A base diffusion window and an emitter contact opening were then made in the $Si_3N_4$ layer, and the base opening made in only the silicon oxynitride layer. After the base diffusion was completed, the surface of the exposed base region was oxidized. The emitter and collector contact openings 28 and 30 were opened in the newly formed oxide layer and silicon oxynitride layer, respectively, using conventional photolithographic techniques. The emitter diffusion of an N-type impurity was performed and contacts etched for metallurgical connections resulting in the structure shown in FIG. 2. The metallurgy was deposited by conventional techniques.

Alternatively, the oxynitride-nitride layer can be applied after base diffusion in order to permit fabrication using dip-open techniques.

An additional alternative would involve the complete removal of the first oxynitride-nitride layer after base diffusion, followed by a blanket silicon oxynitride and silicon nitride layer. Openings can be made for the emitter, base and collector contacts in the silicon nitride layer, but not the oxynitride layer. A resist deposited and exposed to cover the base contact opening permits removal of the silicon oxynitride layer only in the emitter and collector contact regions. Diffusions can then be made forming the emitter and collector contacts. Subsequently, the contact openings would be exposed using dip etching and metallurgy deposited by conventional techniques.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. An oxidation resistant masking layer for a silicon semiconductor body comprised of a first layer of oxygenated silicon nitride material having a refractive index in the range of 1.60 to 1.85 and a thickness greater than 50 Angstroms, said layer contiguous with said body, and an overlying second layer of $Si_3N_4$ bonded to said first layer and having a thickness of at least 100 Angstroms.

2. A process for forming recessed thermal $SiO_2$ isolation regions in a silicon semiconductor body comprising:

forming on the surface of the silicon body a blanket layer of oxygenated silicon nitride of a thickness of at least 50 Angstroms, depositing an overlying blanket layer of $Si_3N_4$ on said first layer, forming openings in the resultant composite layer that define the desired recessed isolation regions, exposing the resultant structure to an oxidizing environment for a time sufficient to form the desired silicon oxide regions.

3. The masking layer of claim 1 wherein said first layer of oxygenated silicon nitride has a thickness greater than 100 Angstroms.

4. The process of claim 3 wherein said blanket layer of oxygenated silicon nitride is formed to a thickness of at least 100 Angstroms.

* * * * *